US007522735B2

(12) United States Patent
Van Tassel

(10) Patent No.: US 7,522,735 B2
(45) **Date of Patent: *Apr. 21, 2009**

(54) ELECTRONIC CIRCUIT WITH SPRING REVERBERATION EFFECT AND IMPROVED OUTPUT CONTROLLABILITY

(76) Inventor: Timothy Dale Van Tassel, 3241 Scott Ave. North, Golden Valley, MN (US) 55422

( * ) Notice: Subject to any disclaimer, the term of this patent is extended or adjusted under 35 U.S.C. 154(b) by 920 days.

This patent is subject to a terminal disclaimer.

(21) Appl. No.: 10/757,833

(22) Filed: Jan. 14, 2004

(65) Prior Publication Data

US 2005/0089175 A1 Apr. 28, 2005

Related U.S. Application Data

(60) Provisional application No. 60/439,984, filed on Jan. 14, 2003.

(51) Int. Cl.
*H03G 3/00* (2006.01)

(52) U.S. Cl. ......................... 381/63; 381/120; 381/118; 84/630; 84/707

(58) Field of Classification Search ............. 381/61–63, 381/118, 120–121, 119; 84/629–630, 707
See application file for complete search history.

(56) References Cited

U.S. PATENT DOCUMENTS 3,800,059 A * 3/1974 Pavia .......................... 84/707
3,980,828 A * 9/1976 Orban .......................... 381/63
4,158,813 A * 6/1979 Ellis et al. .................... 455/116
4,449,234 A * 5/1984 Shibata et al. ................ 381/65
4,489,439 A * 12/1984 Scholz et al. ................. 381/63
4,509,191 A * 4/1985 Miller ......................... 381/63
4,627,094 A * 12/1986 Scholz ........................ 381/61
5,802,182 A * 9/1998 Pritchard ..................... 381/61
6,091,824 A * 7/2000 Lin et al. ...................... 381/63
6,370,039 B1 * 4/2002 Telefus ........................ 363/15
2004/0190727 A1 * 9/2004 Bacon ......................... 381/61

OTHER PUBLICATIONS

"kit Assembly instruction" submitted by Van tassel as prior art. Jameco electronic.*

(Continued)

*Primary Examiner*—Vivian Chin
*Assistant Examiner*—Disler Paul
(74) *Attorney, Agent, or Firm*—Roger Belfay

(57) ABSTRACT

An electronic circuit for adding the effects of reverberation to a high impedance signal produced from an external audio source such as a guitar pickup or a high impedance microphone. The electronic circuit comprises a reverberation effects circuit having pre-amplifier/driver and recovery amplifier sections and a spring reverberation device coupled thereinbetween and a reverberation effects bypass at the circuit's input, prior to switchably passing the audio signal into an input of the pre-amplifier/driver section which comprises a low impedance, high current output for input into the spring reverberation device having an output for passing a low impedance signal to the recovery amplifier section, which suitably serves in increasing the impedance of the signal to a predetermined level acceptable for input into an external sound device such as an amplifier having channel inputs and audio control capabilities, and a power supply circuit having means for switching between a dc volt source and an ac volt source and supplying ±9 volts to integrated circuits (ICs) included in the pre-amplifier/driver and recovery amplifier sections of the reverberation effects circuit.

14 Claims, 5 Drawing Sheets

OTHER PUBLICATIONS

Roy Mallory, "Using Op Amps to Interface to Spring-type Reverb Units," Online Tech Article Appearing on Website (www.members.tripod.com/~roymal/reverb.htm), Nov. 2001.

Craig Anderton, Project No. 1: Preamp, "Electronic Projects for Musicians," 1975, pp. 56-60, Guitar Player Books, New York, NY.

Craig Anderton, Project No. 9: Beat the DI Blues with Iggy, "Do-it-yourself Projects for Guitarists," 1995, pp. 48-51, Miller Freeman Books, San Francisco, CA.

Manufacturer Instruction Literature, Jameco Electronic Components/Computer Products, 20626 Kit Assembly Instructions, Belmont, CA.

* cited by examiner

ELECTRONIC CIRCUIT WITH SPRING REVERBERATION EFFECT AND IMPROVED OUTPUT CONTROLLABILITY

CROSS-REFERENCE TO RELATED APPLICATIONS

This application claims the benefit of priority from U.S. Provisional Application Ser. No. 60/439,984, filed Jan. 14, 2003, entitled "Electronic Circuit and Device for Spring Type Reverberation Effect", the disclosures of which, including all attached documents, are incorporated herein by reference in their entirety for all purposes.

FIELD OF THE INVENTION

The present invention relates in general to an electronic circuit for accepting a high impedance audio signal and adding spring reverberation effect thereto while maintaining an acceptable impedance range for input into an external sound device such as an amplifier, pedal effects device or any other instrument level device.

BACKGROUND OF THE INVENTION

Reverberation is the collection of reflected, discrete sounds or echoes generated from surfaces in an enclosure like an auditorium. Musicians, audiophiles and the like strive to add reverberating effects in recordings and live performances to place a sound within the context of its space or create new sounds of their own, not necessarily relating to any existing physical space. The prior art currently offers electronic reverberation units or techniques which can simulate a number of acoustic environments and give control over the amount of reverberation added to an audio signal. One notable technique is convolution, which involves recording the ambience of a room under controlled conditions and superimposing the resultant recording onto a sound recorded elsewhere. A less costly and more practical approach of reverberation is the spring reverb, which is often electronically made part of some sound mixing boards, pedal effect devices, pre-amplifiers, and guitar amplifiers. Inherent in these devices is the lack of varied means for controlling or manipulating the reverberation effect besides that of the reverberation device such as through the use of an external amplifier or an effects pedal device for improved replication of an acoustical space or increased production of a new sound effect. In most design configurations, the reverberation device, whether it is analog or digitally based, comprises means for accepting an audio signal from a musical source and combining the signal with effects of reverberation followed by amplification collectively occurring internally therewithin. The extent to which reverberation is added to the audio signal and manipulated is primarily controlled at the interface of the of spring reverberation device rather than through other available sound enhancing means. Consequently, limitations are immediately placed upon the musician in attempting to simulate a particular acoustical space, create entirely new sound effects, or replicate sounds of the past, specifically the warm "vintage sound" so often associated with the preferred tube driven spring reverberation devices of the 50's and 60's.

In accordance with the present invention, applicant has appreciably devised an electronic circuit which provides for varied alteration or manipulation of the reverberation effect besides that of the reverberation device to offer the musician or audiophile versatile means to enhance replication of an acoustical space or create entirely new sounds during a recording session or live performance.

BRIEF SUMMARY OF THE INVENTION

In order to overcome the numerous drawbacks apparent in the prior art, a electronic circuit incorporating reverberation has been devised for use with an external sound device such as an amplifier, pedal effects device or other instrument level devices often employed in recordings and live performances.

It is thus an object of the present invention to provide a low cost, non-complicated device which may be reliably used in enhancing the reverberation effect to more accurately simulate a preexisting acoustical environment substantially by means other than those generally made available at the reverberation device.

It is another object of the present invention to provide such an electronic circuit incorporating reverberation which affords versatility to the musician to permit production of sounds not necessarily associated with or related to a known acoustical space.

It is another object of the present invention to provide such an electronic circuit incorporating reverberation which possesses audio signal outputs comprising an impedance level substantially equivalent to an audio signal produced by a musical source such as an electric guitar pickup, harmonica microphone, or high impedance instrument output.

It is another object of the present invention to provide such an electronic circuit incorporating reverberation which is portable for convenient transport to recording sessions and live performances and compatible with most vintage amplifiers lacking in most cases means for adding the effect of reverberation such as a tube driven amplifier.

It is another object of the present invention to provide such an electronic circuit incorporating reverberation which comprises an audio signal bypass of suitable impedance for input into a two channel amplifier to increase the effectiveness of the reverberation effect or newly created sounds.

It is yet another object of the present invention to provide such an electronic circuit incorporating reverberation which accomplishes the foregoing and other objects and advantages and which is economical, durable, and fully effective in performing its intended functions without undue retrofitting of existing sound equipment, including without limitation, amplifiers, effects pedal device, sound mixing boards, etc.

In accordance with the present invention, an electronic circuit incorporating reverberation has been devised for use with an external sound device such as an amplifier or an effects pedal device, the electronic circuit comprising in combination a reverberation effects circuit having a pre-amplifier/driver and recovery amplifier sections and a spring reverberation device coupled thereinbetween, the pre-amplifier/driver section having an input jack for receiving therethrough a high impedance signal produced from an external audio source and a low impedance, high current output for input into the spring reverberation device having an output for passing a low impedance signal to the recovery amplifier section, which suitably increases the impedance of the signal to a predetermined level acceptable for input into the external sound device, and a power supply circuit having means for switching between a dc volt source and an ac volt source and supplying ±9 volts to integrated circuits (ICs) included in the pre-amplifier/driver and recovery amplifier sections of the reverberation effects circuit.

Other objects, features, and advantages of the present invention will become apparent in the following detailed description of the preferred embodiments thereof when read in conjunction with the accompanying drawings in which like reference numerals depict the same parts in the various views.

BRIEF DESCRIPTION OF THE SEVERAL VIEWS OF THE DRAWINGS

A preferred embodiment of the present invention will now be described by way of example with reference to the accompanying drawings, in which.

DETAILED DESCRIPTION OF THE PREFERRED EMBODIMENT

While this invention is susceptible of being embodied in many different forms, the preferred embodiment of the invention is illustrated in the accompanying drawings and described in detail hereinafter with the understanding that the present disclosure is to be considered to exemplify the principles of the present invention and is not intended to limit the invention to the embodiments illustrated and presented herein. The present invention has particular utility as a device for adding and enhancing the effects of reverberation while maintaining an impedance level made suitable for application with external sound devices such as an amplifier, an effects pedal device, or other instrument level device.

Figure 1:
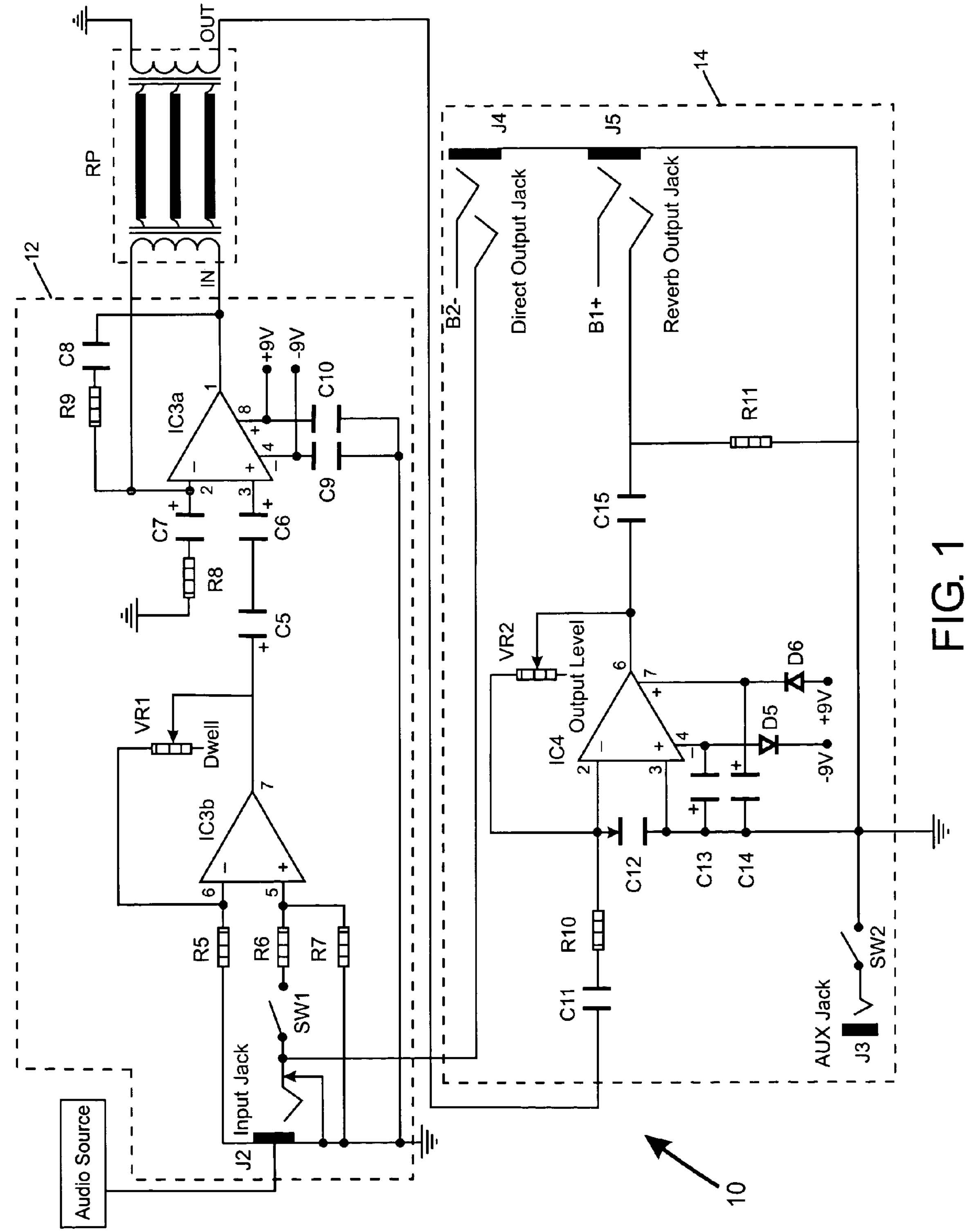
FIG. 1 is a schematic diagram illustrating a reverberation effects circuit of the preferred embodiment of the present invention.
Figure 2:
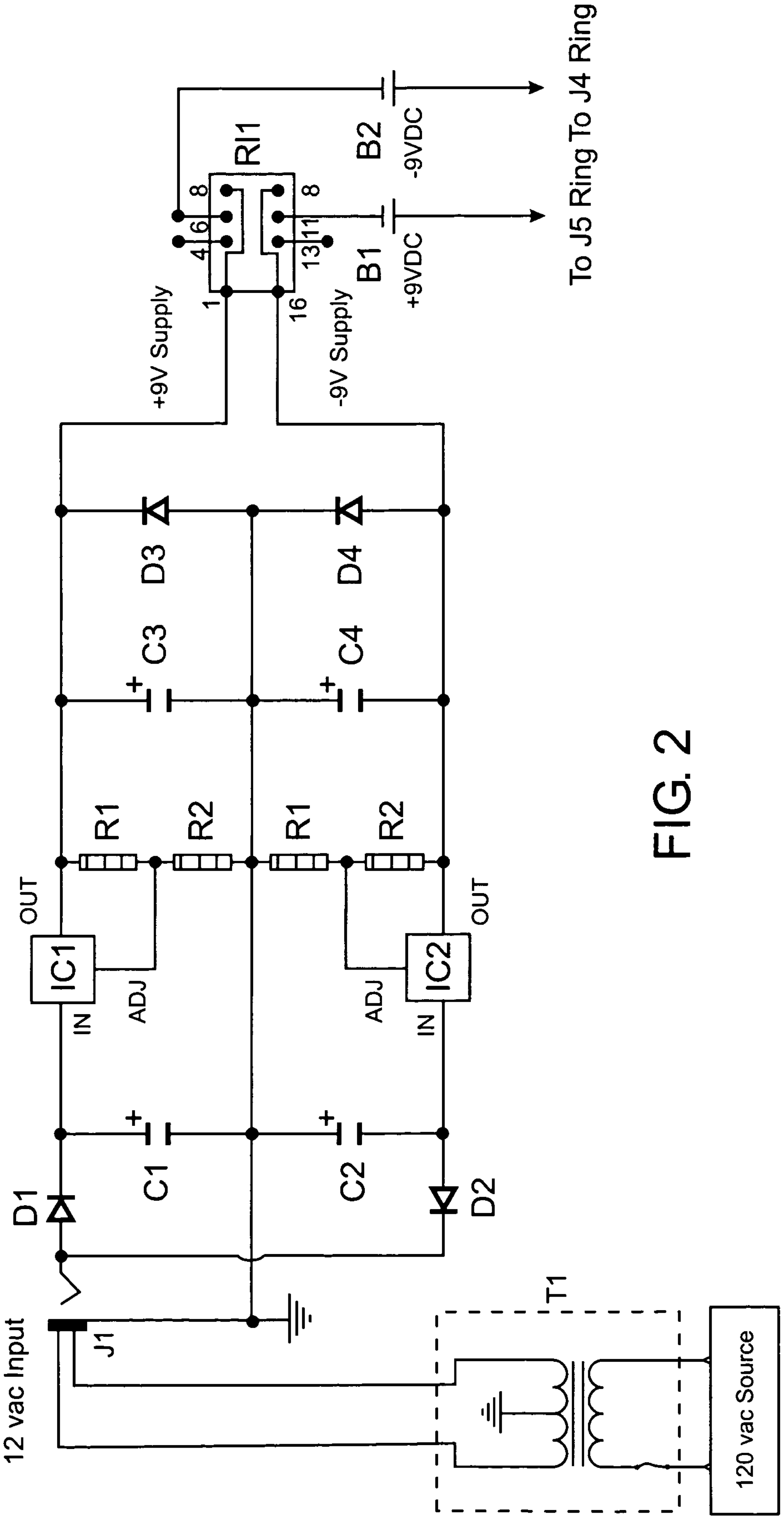
FIG. 2 is a schematic diagram illustrating a power supply circuit of the preferred embodiment of the present invention.

Referring to FIG. 1, there is shown generally at 10 a schematic diagram of the reverberation effects circuit of the present invention driven by a power supply circuit switchable between a conventional high current, low impedance source and a low dc voltage source consisting of a pair of 9 volt batteries as collectively represented in FIG. 2. A relay RL1 operatively switches the power source from dc to ac particularly occurring upon an outside power source of 120 vac/60 Hz being coupled to a transformer T1, notwithstanding the presence of the low dc volt source. In this regard, the power supply is responsive to voltage from a line connection, through transformer and a mono phone jack J1, and includes a conventional rectifying circuit as established by a pair of diode/capacitor groupings of D1, C1 and D2, C2, each grouping of which serving as an appropriate filter for converting an ac voltage source to dc, which is needed to operate a plurality of integrated circuits (ICs) integrally made part of the amplifying sections of the reverberation effects circuit. Given that each of the ICs operate at a specified voltage as determined by the manufacturer, the power supply circuit further comprises a pair of adjustable voltage regulators IC1, IC2, which, acting in concert with a pair of resister groups R1, R2 and R3, R4, respectively, suitably establishes bipolar outputs of 9 volts at approximately 125 milliamps. To further serve in filtering the signal and mitigating the presence of voltage spikes prior to being fed into and coupled to relay RL1, voltage line outputs from IC1 and IC2 each comprise a diode/capacitor grouping of D3, C3 and D4, C4, respectively. As shown in FIG. 2, RL1's normally closed contacts are coupled to 9 volt batteries while the normally open contacts are coupled to the bipolar outputs from IC1 and IC2. Upon coupling the external power supply of 120 vac/60 Hz to T1, RL1 energizes and closes the NO contacts which effectively disconnect the 9 volt batteries from the reverberation effects circuit, more specifically the ICs. Conversely, when T1 is disconnected from the 120 vac/60 Hz source, the ICs become operational from the 9 volt batteries via J4 and J5 phone jacks. Only upon the instance of J4 and J5 being coupled to an external phone plug will the batteries supply power to the reverberation effects circuit, otherwise the batteries will not have a return path to ground. This arrangement effectively serves as a visual safeguard against inadvertently leaving the circuit powered up strictly under battery power.

Referring now to FIG. 1, the reverberation effects circuit further comprises a pre-amplifier/driver circuit 12 for conditionin the audio signal prior to being fed into a reverb pan RP, particularly in terms of setting the correct impedance at the input side of the RP and establishing ample current to drive the transducers inherently made part of the RP and a recovery amplifier section 14 for increasing the signal impedance to a predetermined level prior to being passed to an external sound device. First and second operational amplifiers IC3*a* and IC3*b* are dual op-amp ICs and form the pre-amplifier/driver section of the reverberation effects circuit which primarily amplifies and controls the audio input signal prior to being fed into the input transducer of RP. Audio input signal is initially applied at input connection J2 and branches into two discrete signal pathways, one of which extending from the input to an open phone jack J4, which substantially serves as a reverberation effects bypass, and a second pathway extending to a switch SW1. In a closed state, SW1 passes the audio input signal to the non-inverting input of IC3*b* via R6, which pads the audio signal prior to reaching IC3*b* to prevent possible overloading into IC3*b* which may lead to undesirable distortion and noise. A path to ground via R7 prior to passing the signal to the inverting input of IC3*b* substantially serves in keeping an audio signal feed of a guitar or other high impedance source from being loaded into IC3*b*. A path to ground from J2 effectively serves in protecting signal from noise caused by the presence of RFI and EMI. Amplifier IC3*b* is operated with a negative feedback comprising a 50K linear potentiometer VR1 having variable resistive capacity to appropriately adjust the gain at the output path of IC3, specifically in light of the resistive value of R5 being selectively coupled to the inverting input of IC3*b*. In an operative state, the feedback voltage is dropped by the varying resistive values of VR1 and shunted to ground via R5 and J2, collectively establishing an output at IC3*b* having a low impedance, low noise response and a gain approaching upwards of 20 dB. The output pathway of IC3*b* is coupled to the non-inverting input of IC3*a* via a pair polarized capacitors C5, C6, which appropriately serve to block the passing of any dc signal into IC3*a* while permitting the passage of the audio signal for eventual input into RP. Powering of the dual op-amps IC3*a*, IC3*b* is principally established by the ±9 volt rails from the power supply circuit noted above. A path to ground for the negative and positive voltage leads each incorporate a capacitor C9 and C10, respectively, to suitably filter and establish steady line voltage to IC3*a* and IC3*b*. To effectively reduce the gain at low frequencies at IC3*a*, but allow a moderate increase in gain of high frequencies insofar to enhance the effects of reverberation, the inverting input of IC3*a* is supplied with a resistor/capacitor arrangement R8, C7 shunted to ground. Output from IC3*a* is coupled to the input side of RP and comprises a negative feedback loop having also a resistor/capacitor arrangement R9, C8, which collectively stabilizes the feedback loop and restores phase margin to the IC3*a* networked circuitry. A path to ground from the input side of RP is provided and terminates at the feedback loop of IC3*a* prior to and after the resistor/capacitor arrangements of R8, C7 and R9, C8, respectively. In preferred applications, RP comprises a spring reverberation device of the type having a 3-spring configuration operable at an input impedance of 800 ohms and an output impedance of 2575 ohms, as notably manufactured by Accutronics as Model No. 8EB2C1B. It is noted herein, however, that standalone reverberation devices manufactured by companies other than Accutronics may be suitable for this application providing they meet the above specifications and cooperate with and operate within the limitations of the ICs integrally made part of the amplifier/driver and recovery amplifier sections of the reverberation effects circuit.

Figure 3:
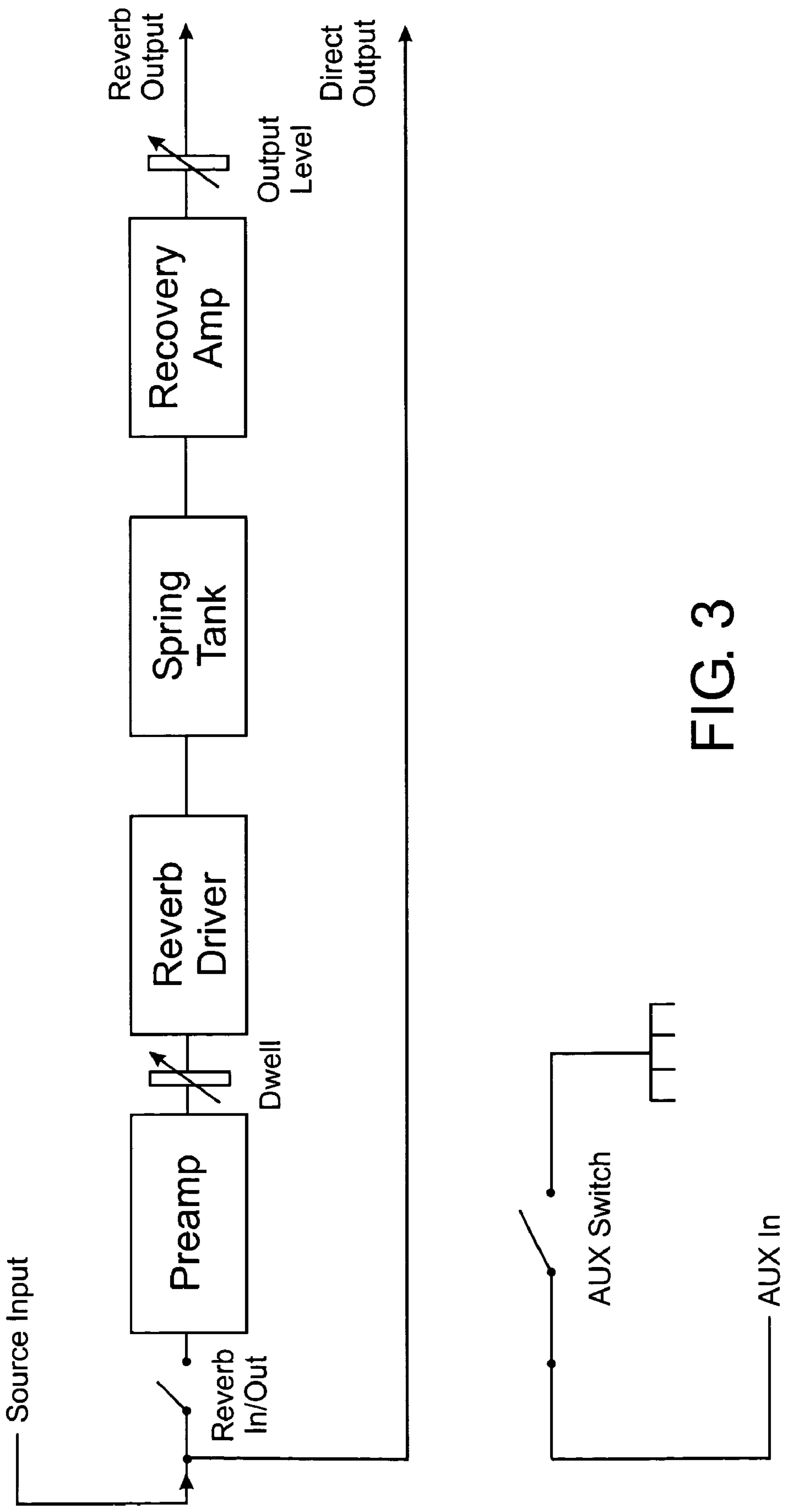
FIG. 3 is a block diagram depicting signal flow through a preferred embodiment of the present invention.

Referring now to the recovery amplifier section 14 of the reverberation effects circuit 10 in FIG. 1, a reverberated output signal from RP is coupled to the inverting input of IC4 via a resistor/capacitor arrangement R10, C11, whereas C11 primarily serves in the capacity of rolling off the low frequency gain of the circuit prior to reaching IC4. A path to ground is provided for the non-inverting input and the inverting input via capacitor C12 to mitigate high frequency feedback at the output of IC4. Like IC3*b*, IC4 comprises an output signal incorporating a negative feedback loop having in line a 50K linear potentiometer VR2 to control accordingly the gain output of approximately 3 dB from IC4, specifically in concert with the resistive capacity of RlO. Powering of IC4 is principally established by the ±9 volt rails from the power supply circuit noted above. Each of the ±9 volt rails receive a diode D6, D5 for filtering applied voltage and ensuring correct polarity passing into IC4. A path to ground for the negative and positive voltage rails each incorporate a capacitor C13 and C14, respectively, to suitably filter and establish steady line voltage to IC4. Output signal from IC4 is directed to an output phone jack J5 via capacitor C15, which suitably serves in filtering voltage spikes to ensure steady line voltage to an external sound enhancing device such as an amplifier or effects pedal device. Coupled in between C15 and J5 is path to ground passing through resistor R11 to reinforce the impedance strength of the signal exiting IC4 and ensure impedance matching with that of the external sound enhancing device. An input jack J3 comprising a switch SW2 provides means for clamping a signal to ground, which is useful in controlling sound effects at the external sound device intermittently during a performance or recording session. A schematic of signal flow through the reverberation effects circuit is provided in FIG. 3.

Table 1 attached hereto lists the values of the circuit components described herein. However, it is to be understood that the invention is not limited to the precise circuit values or even the specific embodiment described above, and no limitation with respect to the specific apparatus illustrated herein is intended or should be inferred. It can be appreciated that numerous variations and modifications may be effected without departing from the true spirit and scope of the novel concept of the invention. It is of course intended to cover by the appended claims all such modifications as fall within the scope of the claims.

TABLE 1

| | |
|---|---|
| C1, C2 | 2200 uf/16 V electrolytic capacitor |
| C3, C4 | 1 of 35 V Tantalum capacitor |
| IC1 | LM317 Adj. +9 volt regulator |
| IC2 | LM337 Adj. −9 volt regulator |
| R1, R4 | 180 ohm ¼ watt metal film resistor |

TABLE 1-continued

| | |
|---|---|
| R2, R3 | 1.15k ¼ watt metal film resistor |
| D1-D4 | 1 n4001 diode |
| RL1 | 24 volt dpdt dip relay |
| SW1, SW2 | spst Carling footswitch |
| R5, R9 | 2.2k ¼ watt metal film resistor |
| R6 | 1k ¼ watt metal film resistor |
| R7 | 1M ¼ watt metal film resistor |
| R8 | 47 ohm ¼ watt metal film resistor |
| R10 | 22K ¼ watt metal film resistor |
| R11 | 10K ¼ watt metal film resistor |
| D5, D6 | In914 diode |
| C5, C6 | 47 uf/50 v electrolytic capacitor |
| C7 | 10 uf/50 v electrolytic capacitor |
| C8 | .01 of/100 v polyester film capacitor |
| C9, C10 | .1 of/50 v polyester film capacitor |
| C11 | .22 uf/50 v polyester film capacitor |
| C12 | 270 pf ceramic disc capacitor |
| C13, C14, C15 | 100 uf/25 v electrolytic capacitor |
| VR1, VR2 | 50K linear potentiometer |
| IC3a, IC3b | 5532 Dual Operational amplifier |
| IC4 | 741 Single Operational amplifier |
| J1 | 3.5 mm mono phone jack |
| J2 | ¼" mono closed phonejack |
| J3 | ¼" mono open phone jack |
| J4, J5 | ¼" stereo open phonejack |
| T1 | 120 vac primary/12 vac secondary, rated @ 500 mA w/3.5 mm phone plug |
| B1, B2 | 9 volt Alkaline Battery |
| RP | Accutronics ® Model 8EB2C1B |

Figure 4:
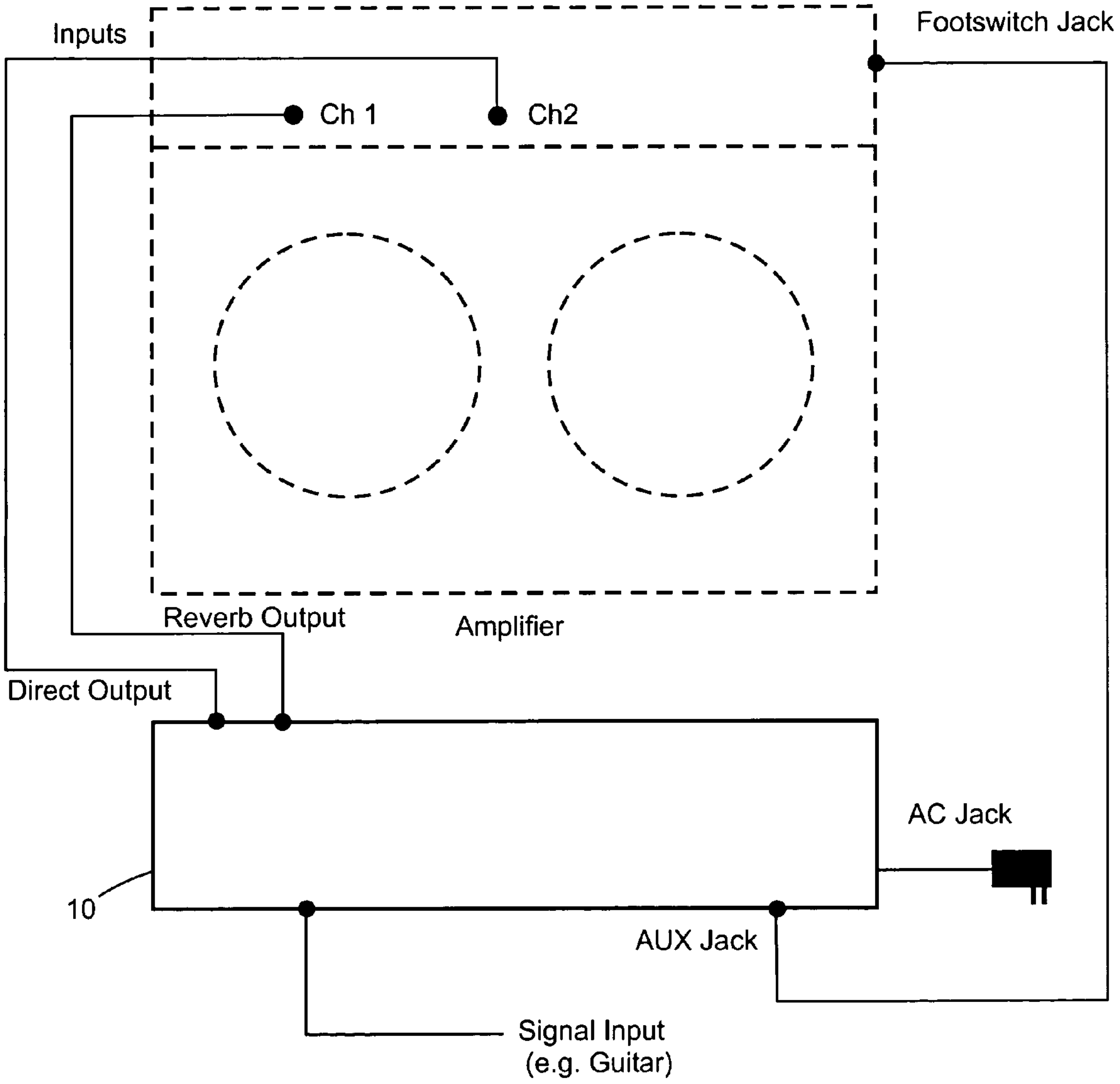
FIG. 4 is a block diagram illustrating the preferred embodiment of the present invention in a two-channel configuration.
Figure 5:
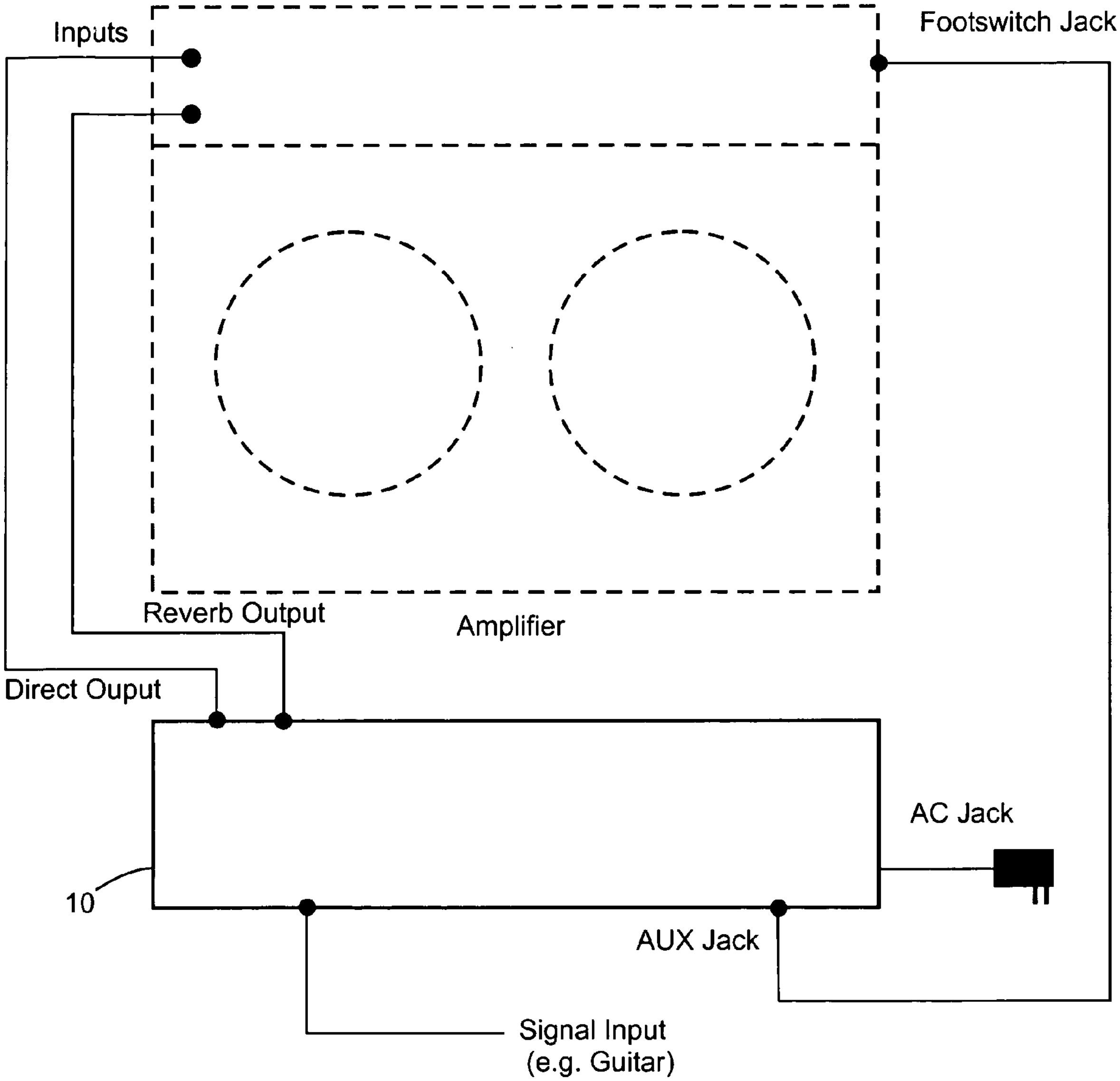
FIG. 5 is a block diagram illustrating the preferred embodiment of the present invention in a one-channel configuration.

In operation, a musical instrument such as a guitar or a harmonica microphone having an output line feed is coupled to J2. Activating SW1 simultaneously provides passage of the audio signal to the reverberation effects circuit for addition of reverb and directly into the external sound enhancing device such as a guitar amplifier, effectively bypassing the addition of reverberation. In a two-channel configuration as shown in FIG. 4, which comprises dedicated controls for both channels at the amplifier, the guitar's direct output is coupled to one channel and the audio signal exiting the reverberation effects circuit via J5 is coupled to the second channel. Using this configuration, the dwell and output level controls referred herein as VR1 and VR2, respectfully, together with the volume and tonal controls of the amplifier collectively serve as further means for controlling the effects for reverberation for a more accurate simulation of an acoustical space or creation of a new sound effect. In a one-channel configuration as shown in FIG. 5, which comprises two instrument inputs at the amplifier, the effects of reverberation is balanced with the guitar's direct sound through use of VR1 and VR2 at the reverberation effects circuit. Regardless of the configuration of connectivity, the reverberation effects circuit outputs J4 and J5 are preferably fitted with shielded cable of the guitar or microphone type utilizing a ¼" phone plug. Final operational setup involves configuring the power supply circuit to accept either ac voltage from an outside 120 vac/60 Hz power source or dc voltage supplied by a pair of 9 volt batteries. In a configuration utilizing ac power, T1 is coupled to J1 with line inputs of T1 being coupled to an external 120 vac/60 Hz power supply. In a configuration utilizing dc power, the reverberation effects circuit is operational upon installing a pair of 9 volts batteries, connecting cables of suitable type to J4 and J5, and disconnecting T1 from the power supply circuit. Following the application of power to the reverberation effects circuit and guitar amplifier, the guitar amplifier is activated while the volume controls of the amplifier are adjusted accordingly for each channel. VR1 (dwell) suitably controls the extent to which reverberation is added to the audio signal, while VR2 controls the level of the reverb signal. To remove the effects of reverberation from the amplified signal, depress SW 1. To re-activate the effects of reverberation, depress SW 1 one additional time.

To create distinct sounds for application during recordings and live performances, the reverberation effects circuit outputs J4 and J5 can be coupled in a particular manner with an external amplifier having instrument inputs for each channel and audio control capabilities (e.g., base, treble and volume). For instance, the reverberation effects circuit output at J5 can be coupled to a tremolo channel of the external amplifier, while the direct signal output at J4 can be coupled to a normal channel of the amplifier to create a realistic echo effect by utilizing the frequency and depth controls of the external amplifier and VR1 and VR2 at the reverberation effects circuit. In an another example, the depth of the reverberation effect can be effectively increased by passing the signal from an external audio source (e.g., guitar) into an external reverberation amplifier via J4 and coupling J5 to the normal channel of an external amplifier for simultaneous reverberation effect from two sources. Although the present invention is described by way of example to cooperate and function with an external amplifier, other applications may be utilized to facilitate the addition of reverberation to an audio signal given that the input at J2 can accept a high impedance source and that the outputs at J4 and J5 can pass along a high impedance signal matching most other instrument devices, including without limitation modern console pre-amplifiers with direct injection (DI) for balancing line level outputs and pedal type effect units. In this regard, instrument devices of these types may be coupled to J2 or J5 without adversely impacting the reverberation effects circuit.

While there has been shown and described a particular embodiment of the invention, it will be obvious to those skilled in the art that various changes and alterations can be made therein without departing from the invention and, therefore, it is aimed in the appended claims to cover all such changes and alterations as fall within the true spirit and scope of the invention.

I claim:

1. An electronic circuit for adding reverberation effects to an audio signal generated from an external high impedance source and passing the reverberated signal at a predetermined impedance for input into an external sound device, said electronic circuit comprising, in combination:

(a) a reverberation effects circuit having pre-amplifier/driver and recovery amplifier sections and a spring reverberation device coupled thereinbetween, said pre-amplifier/driver section having an input jack for receiving therethrough a high impedance signal produced from an external audio source, a DC isolation filter, and a low impedance, high current output for input into said spring reverberation device having an output for passing a low impedance signal to said recovery amplifier section for increasing the impedance of the signal to a level acceptable for input into the external sound device, said spring reverberation device employs three springs with each of said springs having a first spring end and a second spring end and each of the three first spring ends connected to a single first spring end connecting bar, and each of the three second spring ends connected a second spring end connecting bar, said pre-amplifier/driver section comprises first and second operational amplifiers each having inverting and non-inverting inputs and an output, each of said outputs comprising a negative feedback loop coupled to said inverting inputs and shunted to ground for setting a predetermined gain value at said output, said first operational amplifier comprises a switch at said non-inverting input for controlling the audio signal path through said reverberation effects circuit and a path to ground comprising resistive capacity for maintaining an impedance level into said first operational amplifier and keeping the audio source from being loaded.

2. An electronic circuit for adding reverberation effects to an audio signal generated from an external high impedance source and passing the reverberated signal at a predetermined impedance for input into an external sound device, said electronic circuit comprising, in combination:

(a) a reverberation effects circuit having pre-amplifier/driver and recovery amplifier sections and a spring reverberation device coupled thereinbetween. said pre-amplifier/driver section having an input jack for receiving therethrough a high impedance signal produced from an external audio source, a DC isolation filter, and a low impedance, high current output for input into said spring reverberation device having an output for passing a low impedance signal to said recovery amplifier section for increasing the impedance of the signal to a level acceptable for input into the external sound device, said spring reverberation device employs three springs with each of said springs having a first spring end and a second spring end and each of the three first spring ends connected to a single first spring end connecting bar, and each of the three second spring ends connected a second spring end connecting bar, said pre-amplifier/driver section comprises first and second operational amplifiers each having inverting and non-inverting inputs and an output, each of said outputs comprising a negative feedback loop coupled to said inverting inputs and shunted to ground for setting a predetermined gain value at said output, said output of said first operational amplifier is coupled to said non-inverting input of said second operational amplifier, said input comprising a filter for blocking passage of dc signals while allowing passage of the audio signal into said second operational amplifier, said negative feedback loop of said second operational amplifier comprising a resistor/capacitor arrangement for stabilizing said feedback loop and restoring phase margin to said second operational amplifier.

3. An electronic circuit for adding reverberation effects to an audio signal generated from an external high impedance source and passing the reverberated signal at a predetermined impedance for input into an external sound device, said electronic circuit comprising, in combination:

(a) a reverberation effects circuit having pre-amplifier/driver and recovery amplifier sections and a spring reverberation device coupled thereinbetween, said pre-amplifier/driver section having an input jack for receiving therethrough a high impedance signal produced from an external audio source, a DC isolation filter, and a low impedance, high current output for input into said spring reverberation device having an output for passing a low impedance signal to said recovery amplifier section for increasing the impedance of the signal to a level acceptable for input into the external sound device, said spring reverberation device employs three springs with each of said springs having a first spring end and a second spring end and each of the three first spring ends connected to a single first spring end connecting bar, and each of the three second spring ends connected a second spring end connecting bar, said recovery amplifier section comprises a single operational amplifier having an inverting input for receiving a reverberated signal from said reverberation device, a non-inverting input shunted to ground and an output comprising a negative feedback loop coupled to said inverting input for setting the reverberated signal at a predetermined gain and impedance for input into the external sound device.

4. The electronic circuit as set forth in claim 3, wherein said negative feedback loop of said single operational amplifier comprises a linear potentiometer having variable resistive capacity to variably adjust gain and establish a predetermined impedance of the signal at said output suitable for input into the external sound device.

5. A method for adding reverberation effects to an audio signal generated from an external high impedance device and passing the reverberated signal at a predetermined impedance for input into an external sound device, said method comprising the steps of:

(a) sending the audio signal into an non-inverting input of a first operational amplifier having an inverting input shunted to ground and an output comprising a negative feedback loop coupled to said inverting input for setting a predetermined gain value and impedance at said output prior to being coupled to a non-inverting input of a second operational amplifier having an inverting input shunted to ground and a low impedance, high current output for input into a spring reverberation device having an output for passing therethrough a reverberated signal;

(b) passing the audio signal through a DC-Isolation filter;

(c) passing the reverberated signal into an inverting input of a single operational amplifier having a non-inverting input shunted to ground and an output having a negative feedback loop coupled to said inverting input for setting a predetermined gain and impedance acceptable for input into the external sound device.

6. The method of claim 5 wherein the spring reverberation device comprises three springs with each of said springs having a first spring end and a second spring end and each of the three first spring ends connected to a single first spring end connecting bar, and each of the three second spring ends connected a second spring end connecting bar.

7. A method as set forth in claim 6 wherein said negative feedback loop of said first operational amplifier comprises a linear potentiometer having variable resistive capacity to variably adjust gain of the signal and establish low impedance at said output of said first operational amplifier.

8. A method as set forth in claim 6 wherein said negative feedback loop of said second operational amplifier comprises a resistor/capacitor arrangement for stabilizing said feedback loop and restoring phase margin to said second operational amplifier.

9. A method as set forth in claim 6 further comprising the step of coupling a switch at said non-inverting input of said first operational amplifier for controlling the addition of reverberation to the audio signal and a reverberation effects bypass prior to said switch for maintaining the integrity and impedance of the audio signal for direct input into the external sound device.

10. An electronic circuit for adding reverberation effects to an audio signal generated from an external high impedance source and passing the reverberated signal at a predetermined impedance for input into an external sound device, said electronic circuit comprising, in combination:

(a) first and second operational amplifiers each having inverting and non-inverting inputs and an output, each of said outputs comprising a negative feedback loop coupled to said inverting inputs and shunted to ground, said negative feedback loop of said first operational amplifier comprising a linear potentiometer having variable resistive capacity to variably adjust gain of the signal and establish low impedance at said output of said first operational amplifier, said negative feedback loop of said second operational amplifier comprising a resistor/capacitor arrangement for stabilizing said feedback loop and restoring phase margin to said second operational amplifier;

(b) a DC Isolation filter interposed between said first and said second operational amplifiers;

(c) a spring reverberation device having an input for accepting a low impedance, high current signal from said output of second operational amplifier and an output for passing therethrough a reverberated signal; and (d) a single operational amplifier having a non-inverting input shunted to ground and an output having a negative feedback loop coupled to said inverting input for setting a predetermined gain and impedance acceptable for input into the external sound device.

11. The electronic circuit of claim 10 wherein the spring reverberation device employs three springs with each of said springs having a first spring end and a second spring end and each of the three first spring ends connected to a single first spring end connecting bar, and each of the three second spring ends connected a second spring end connecting bar.

12. The electronic circuit as set forth in claim 11, wherein said negative feedback loops of said first and single operational amplifiers each comprise a linear potentiometer having variable resistive capacity to variably adjust gain of the signal and a predetermined impedance at said outputs of said first and second operational amplifiers.

13. The electronic circuit as set forth in claim 11, wherein said negative feedback loop of said second operational amplifier comprises a resistor/capacitor arrangement for stabilizing said feedback loop and restoring phase margin to said second operational amplifier.

14. The electronic circuit as set forth in claim 11, wherein said output from said single operational amplifier comprises a capacitive capacity to filter voltage spikes prior to passing the signal to the external sound device and a path to ground having resistive capacity to reinforce the impedance of the signal from said single operational amplifier to match the impedance with that of the external sound device.

* * * * *